United States Patent
Martin et al.

(10) Patent No.: US 6,365,491 B1
(45) Date of Patent: Apr. 2, 2002

(54) METHOD FOR FORMING A UNIFORM NETWORK OF SEMICONDUCTOR ISLANDS ON AN INSULATING SUBSTRATE

(75) Inventors: François Martin, Grenoble; Jean-Michel Nunzi, Antony; Brigitte Mouanda, St Arnoult en Yvelines; Serge Palacin, Montigny-le-Bretonneux; Jean-Philippe Bourgoin, Voisins le Bretonneux, all of (FR)

(73) Assignee: Commissariat a l'Energie Atomique, Paris (FR)

( * ) Notice: Subject to any disclaimer, the term of this patent is extended or adjusted under 35 U.S.C. 154(b) by 0 days.

(21) Appl. No.: 09/554,277
(22) PCT Filed: Dec. 17, 1998
(86) PCT No.: PCT/FR98/02769
§ 371 Date: Jun. 6, 2000
§ 102(e) Date: Jun. 6, 2000
(87) PCT Pub. No.: WO99/33099
PCT Pub. Date: Jul. 1, 1999

(30) Foreign Application Priority Data

Dec. 19, 1997 (FR) ............................................. 97 16158

(51) Int. Cl.⁷ .............................................. H10L 21/20
(52) U.S. Cl. ........................ 438/479; 438/478; 148/33.2
(58) Field of Search ................................. 438/497, 479, 438/496, 584, 758

(56) References Cited

U.S. PATENT DOCUMENTS 5,281,283 A * 1/1994 Tokunaga et al. .......... 148/33.2

FOREIGN PATENT DOCUMENTS

| EP | 7-50353 | 12/1996 |
| EP | 0750353 A2 * | 12/1996 |
| EP | 0788149 | 8/1997 |
| FR | 2666092 | 2/1992 |
| JP | 63-239920 | 10/1988 |
| WO | WO 973633 | 10/1997 |

OTHER PUBLICATIONS

"Surface Chemistry of Silica And Silicates", pp. 248–253, Colloid Chemistry of Silica and Silicates.

(List continued on next page.)

*Primary Examiner*—David Nelms
*Assistant Examiner*—Dung A Le
(74) *Attorney, Agent, or Firm*—Burns Doane Swecker & Mathis LLP

(57) ABSTRACT

A method of forming a network of islands (124) of semiconductor material on an electrically insulating material (112), comprising: p1 a) the deposition of nucleation kernels (122) on the surface of the electrically insulating material, b) the formation of islands of semiconductor material (124) respectively on the nucleation kernels.

In accordance with the invention, the deposition of the nucleation kernels is effected using at least one so-called distribution layer (116) made of a material having a substantially regular molecular structure, formed on the surface of the electrically insulating material (112), in order to distribute the nucleation kernels in a substantially regular fashion on the surface of the electrically insulating material.

17 Claims, 3 Drawing Sheets

OTHER PUBLICATIONS

Abstract: Voutsas et al., "Surface Treatment Effect on the Grain Size and Surface Roughness of as–Deposited LPCVD Polysilicon Films," pp. 282–288, J. Electrochem. Soc., vol. 140, No. 1 Jan. 1993, The Electrochemical Society, Inc..

Takiyama et al., "Dielectric Degradation Of Silicon Dioxide Films Caused by Metal Contaminations," pp. 346–356.

Abstract: Claassen et al., "The Nucleation of CVD Silicon on $SiO_2$ and $Si_3N_4$ Substrates," pp. 1353–1359, J. Electrochem. Soc.,vol. 128, No. 6, Jun. 1981.

Tiwari, S., et al., "A Silicon Nanaocrystals Based Memory," vol. 68, No. 10, 3 pages.

Isz, S.., et al., "Supramolecular Architecture in Langmuir–Blodgett Films" "Molecular Thick Conducting Membranes," vol. 71, No. 1–03, 2 pages.

Hua, Y. L., et al., "Substituted Silicon Phthaloccyanine Langmuir–Blodgett Film and Its Possible Use in Electronic Devices,"vol. 192, No. 2, 8 pages.

Katayama, K., et al., "ANew Field–Effect Transistor Based on the Metal–Insulator Transistor,"vol. 79, No. 5, 7 pages.

* cited by examiner

METHOD FOR FORMING A UNIFORM NETWORK OF SEMICONDUCTOR ISLANDS ON AN INSULATING SUBSTRATE

TECHNICAL FIELD

The present invention relates to a method of forming a regular network of semiconductor islands on an insulating substrate. Such semiconductor islands can be used for manufacturing quantal devices such as devices using a Coulomb blocking phenomenon.

The Coulomb blocking phenomenon occurs in conductive or semiconductor islands both insulated electrically from their environment and weakly coupled thereto by tunnel effect. Using this phenomenon at temperatures close to room temperatures requires the total capacitance of each island to be around 1 attofarad. The dimensions of the islands are generally around 1 nanometer.

The invention finds applications notably in the manufacture of logic circuits and memories with a very high integration density.

PRIOR ART

The accompanying FIG. 1 depicts a highly schematic plan view of a device 10 using semiconductor islands.

References 12 and 14 designate first and second electron reservoirs of the quantal effect device 10, whose functioning uses the Coulomb blocking phenomenon. These reservoirs are, for example, the drain and source of a structure of the field effect transistor type, or a microelectronic device such as a memory.

Between the two electron reservoirs 12, 14 there is a region with a set of semiconductor islands 16, or grains.

During the manufacture of such a region, it is found that the formation of the islands is random and irregular.

When the formation of the islands is obtained by a nucleation process, it complies with a statistical distribution law for the nucleation centres fixed by known thermodynamic laws and set out, for example, in the article "The Nucleation of CVD Silicon on $SiO_2$ and $Si_3N_4$ Substrates" by W. Claassen, et al., Journal of the Electrochemical Society 128, No 6, pp. 1353–1359, (1981). It is known for example that a silicon nitride surface is more favorable to a high nucleation density than a silica ($SiO_2$) surface since the mechanism for the deposition of silicon from silane is based on the formation of species of the $SiH_2$ type which diffuse rapidly on a surface with a high density of OH bonds, such as an $SiO_2$ surface.

It is also known that the nucleation density of silicon can be increased by specific treatments. In a treatment described in the article "Surface Treatment Effect on the Grain Size and Surface Roughness of as-Deposited LPCVD Polysilicon Films" by A. T. Voutsas, et al., Journal of the Electrochemical Society 140, No 1, pp. 282–288, (1993), the nucleation densities obtained after cleaning of the silica in a chemical bath (notably in a bath based on sulphuric acid and hydrogen peroxide), are greater than those obtained without treatment. This phenomenon is probably attributable to the presence of impurities left by the bath on the surface of the silica.

However, the nucleation, even when it is assisted by impurities, remains a statistical phenomenon, which does not make it possible to create regularly spaced islands of silicon.

The irregularity of the distribution of the nucleation kernels, and therefore of the islands of semiconductor material, is accompanied by a lack of homogeneity of the size of the islands. This phenomenon limits the quality and performance of the Coulomb blocking electronic devices, using such a structure.

DESCRIPTION OF THE INVENTION

The purpose of the present invention is to propose a method of forming a network of islands regularly spaced apart on an electrically insulating support.

One aim is also to propose such a method for obtaining islands of homogeneous size.

Another aim is to propose an electronic device of the Coulomb blocking type using a network of regularly spaced islands, obtained in accordance with the invention.

To achieve these aims, the object of the invention is more precisely a method of forming a network of islands of semiconductor material on a surface of an electrically insulating material. The method comprises:

a) the deposition of nucleation kernels on the surface of the electrically insulating material, by means of an auto-organisation process, b) the formation of islands of semiconductor material on each of the nucleation kernels.

In accordance with the invention, the deposition of the nucleation kernels is effected using at least one layer, referred to as a distribution layer, made of a material having a substantially regular molecular structure, formed on the electrically insulating material surface, in order to distribute the nucleation kernels in a substantially regular fashion on the surface of the electrically insulating material by means of an auto-organisation process.

Semiconductor islands means grains of semiconductor material formed by growth on the nucleation kernels. These grains have small dimensions of between, for example, 1 and 10 nanometers. Their growth can be assisted or promoted by means of a heat treatment.

In addition, nucleation kernel means any impurity able to promote the local formation of a semiconductor grain, in particular a crystal. The impurity can cause the formation of the crystal either directly, or indirectly by causing in the surface of the electrically insulating material a local structure modification able to promote the formation of the semiconductor crystal. The kernels are, in particular, atoms.

The distribution layer can, in accordance with particular embodiments of the invention, be used either as a mask for the deposition of kernels, or directly as a kernel addition layer.

According to the first particular embodiment proposed, use is made of a distribution layer made of a material with a molecular structure having interstices spaced apart substantially regularly, and the nucleation kernels are deposited using the distribution layer as a deposition mask for uniformly distributing the nucleation kernels, the distribution layer being eliminated after the deposition of the nucleation kernels.

By way of example, the material used for the distribution layer can be an organic material of the phthalocyanine or porphyrin type (a molecule with a porphyry core). These molecules can be functionalised, that is to say can carry substituents, so as to initiate between them chemical bonds with fixed lengths. This auto-organisation process makes it possible to bring the kernels (in particular metallic centres) to a fixed and determined distance from each other.

The kernels are, for example, made of a metal such as, preferentially, Al, Mg, Ca, Se. These metals, in atomic form, are able to interact on the surface of the silica. Other metals such as Cu or Ni can also be used. These metals are however liable to diffuse, even at low temperature, in the insulating material, when the latter is made of silica.

The kernels are distributed on the distribution layer in order to fit in the interstices and be fixed on the insulating surface in the interstices. The fixing of the kernels on the insulating surface takes place notably by chemical sorption.

To allow an easy fitting of the kernels in the interstices of the distribution layer, this layer can, preferably, be produced in a monolayer form, that is to say in the form of a monomolecular layer. In this case, the molecules are functionalised so as to make them suitable for deposition in a monomolecular layer.

The formation of a monomolecular layer can take place, for example, according to a technique, known per se, referred to as the Langmuir-Blodgett technique. In this regard reference can be made to the French document FR-A-2 666 092 (Feb. 28, 1992.).

According to the second particular embodiment of the proposed invention, use is made of a distribution layer made of a material having a molecular support structure and nucleation kernels regularly distributed on the molecular support structure. After putting this layer on the surface of the insulating material, a treatment is carried out to separate the nucleation kernels, fixed on the surface of the insulating material, and the support structure, in order to eliminate this structure.

The material of the distribution layer is for example an organometallic material having metal sites, forming the kernels, in a molecular structure having auto-organisation properties in order to ensure a regular distribution of the metallic sites on the surface of the insulating material. By way of example, the material of the distribution layer can consist of porphyrins or phthalocyanines, or cage molecules complexing metallic ions, such as calixarenes and cyclodextrins.

By way of example, when the insulating material is silica ($SiO_2$), the nucleation kernels can include a metal chosen from amongst Fe, Al, Ca and Mg. The deposition of the nucleation kernels is accompanied by a heat treatment enabling the metal to interact with the silica.

A heat treatment then allows modification of the silica surface to locally form compounds of the silicate type such as $FeSiO_4$, $\frac{1}{2}Mg_2SiO_3$, $\frac{1}{2}Mg_2SiO_4$, or $CaSiO_4$ or of the tetrahedral aluminum type. In his regard reference can be made to documents "Dielectric Degradation of Silicon Dioxide Films Caused By Metal Contaminations" by M. Takiyama, et al., $7^{th}$ International Symposium on Silicon Material Science and Technology PV 94-10 (Electrochemical Society 1994) and "The Colloid Chemistry of Silica and Silicates", by R. K. Iler, p. 250 Cornell University Press (1955).

These compounds locally modify the surface of the silica and thus promote the formation of semiconductor islands.

The treatment, in order to separate the nucleation kernels and the molecular support structure of the distribution layer, includes a heat treatment and/or a treatment by ultraviolet radiation. This treatment destroys and eliminates the molecular support structure.

Another object of the invention is a method of manufacturing a quantal device of the Coulomb blocking type having a network of semiconductor islands, in which the network of islands is produced in accordance with the method described above.

Finally, the invention relates to an electronic device of the Coulomb blocking type, comprising first and second electron reservoirs separated by a region including a set of nanometric semiconductor islands formed on an electrically insulating substrate, and in which the islands are regularly spaced apart on the electrically insulating substrate.

The first and second reservoirs are, for example, the source and drain of a transistor structure or memory cell structure.

Other characteristics and advantages of the present invention will emerge more clearly from the following description, with reference to the figures of the accompanying drawings. This description is given purely for illustration and non-limitatively.

DETAILED DESCRIPTION OF EMBODIMENTS OF THE INVENTION

Figure 1:
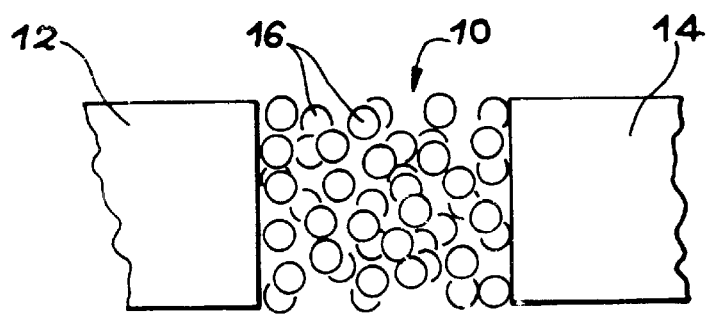
FIG. 1, already described, is a highly schematic plan view of a quantal effect device using a Coulomb blocking phenomenon.
Figure 2:
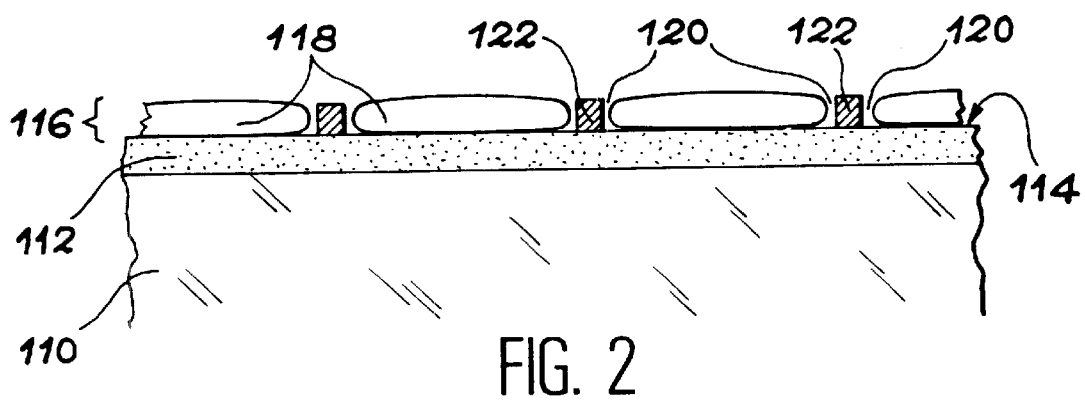
FIG. 2 is a schematic section of an insulating support on which a distribution monolayer has been formed having interstices, the interstices being filled in by nucleation kernels.

Reference 110 in FIG. 2 indicates a substrate such as, for example, a silicon or glass substrate, on which there is formed a layer 112 of electrically insulating material such as silica ($SiO_2$) or silicon nitride ($Si_3N_4$).

On the surface 114 of the layer 112 of electrically insulating material there is or are formed one or more monomolecular layers 116 of a material whose molecules are arranged in an auto-organised manner according to a substantially regular pattern. The molecules are depicted schematically with the reference 118. The dimensions of the molecules are considerably exaggerated for reasons of clarity.

The deposition of the monomolecular layers 116 can be effected in accordance with the so-called Langmuir-Blodgett method or by auto-assembly. To obtain a suitable deposition, the molecules can be functionalised (for example by adding aliphatic chains) so as to make them suitable for deposition by the Langmuir-Blodgett method. The monomolecular layers are, for example, layers of porphyrin.

The material used is chosen so that the molecules of the different monolayers can be superimposed so as to define interstices or empty channels.

In FIG. 2, only one monomolecular layer has been shown, which has interstices 120 between molecules 118.

Nucleation kernels 122, such as for example the metal atoms already cited, are then deposited on the distribution layer 116 in order to be housed in the interstices 120.

The nucleation kernels are fixed by adsorption on the surface of the layer 112 of insulating material. This fixing can be assisted possibly by a heat treatment.

After the fixing of the kernels 122, the distribution layer or layers 116 can be eliminated. This can be effected by means of a heat treatment and/or UV treatment.

After the elimination of the distribution layer, a semiconductor is formed on the surface of the sample by a chemical vapour deposition or by an evaporation process, for example.

In the example described, a deposition of silicon is carried out using silane or polysilane.

Figure 3:
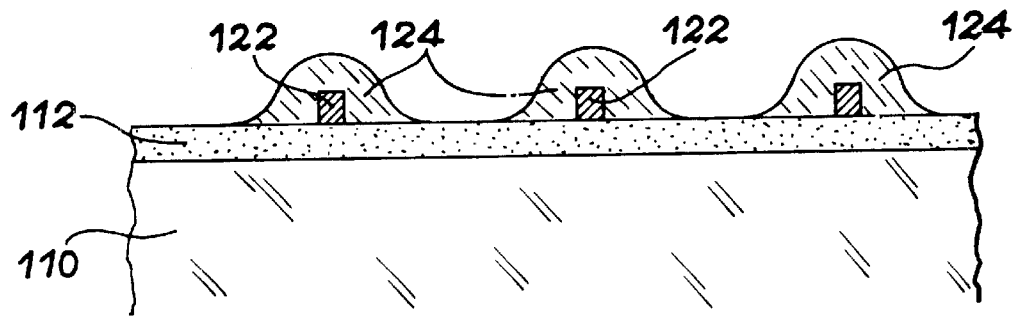
FIG. 3 is a schematic section of the support of FIG. 2 on which islands of semiconductor material have been formed.

The silicon deposition is assisted by the nucleation kernels 122 around which silicon islands 124 respectively form, visible in FIG. 3.

The deposition of silicon is continued until islands are obtained at the required size.

By way of example, the islands can have a radius of 2.5 nm and be mutually separated by a distance of around 10 nm. Thus a surface density of islands of $10^{12}/cm^2$ can be obtained.

In addition, the islands have a substantially homogeneous size.

Figure 4:
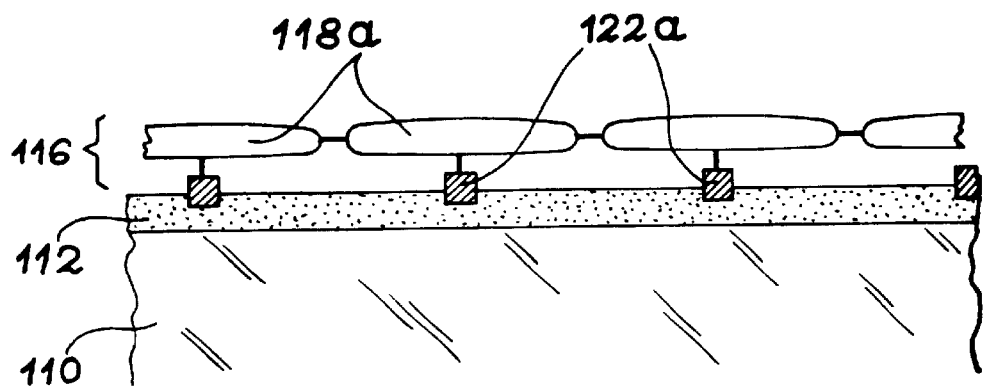
FIG. 4 is a schematic section of an insulating support on which a distribution monolayer has been formed with a molecular support structure and nucleation kernels fixed on the support structure.

FIG. 4 shows a variant embodiment of the invention. For reasons of clarity, identical references are allocated to parts of this figure which are identical or similar to those of the previous figures.

On the layer 112 of insulating material, made of silica in the example described, a distribution layer 116 is formed as for the implementation corresponding to FIG. 2.

However, the material used for forming the distribution layer 116 of FIG. 4 contains nucleation kernels 122a. The layer 116 thus constitutes a kernel addition layer.

More precisely, it can be considered that the material used for forming the distribution layer 116 has a molecular support structure 118a which has locally, at regularly spaced locations, atoms 122a which can constitute the nucleation kernels.

It is possible to use, for example, organometallic compounds having a structure of the porphyrin type (organometallic with porphin core) or cage molecules complexing metallic ions such as, for example, calixarenes or cyclodextrins.

Figure 5:
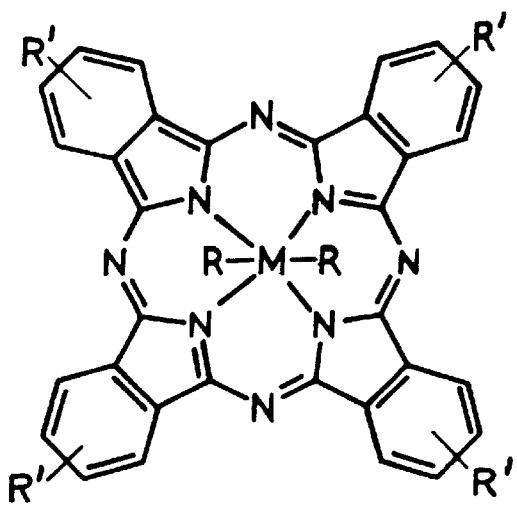
FIGS. 5, 6 and 8 are representations of the formulae of materials which can be used for producing the distribution layer of FIG. 4.
Figure 6:
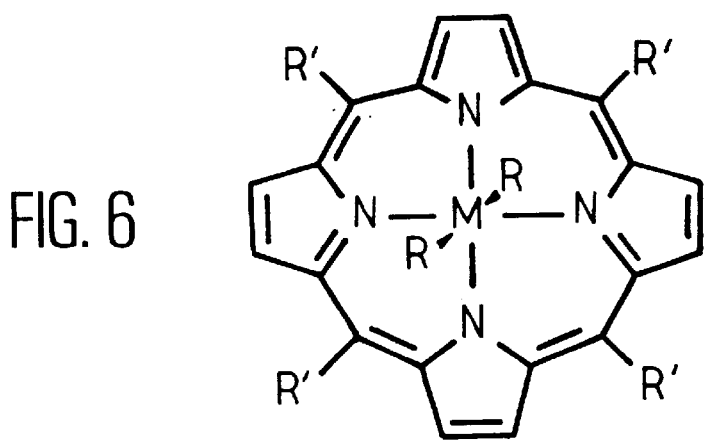
Figure 7:
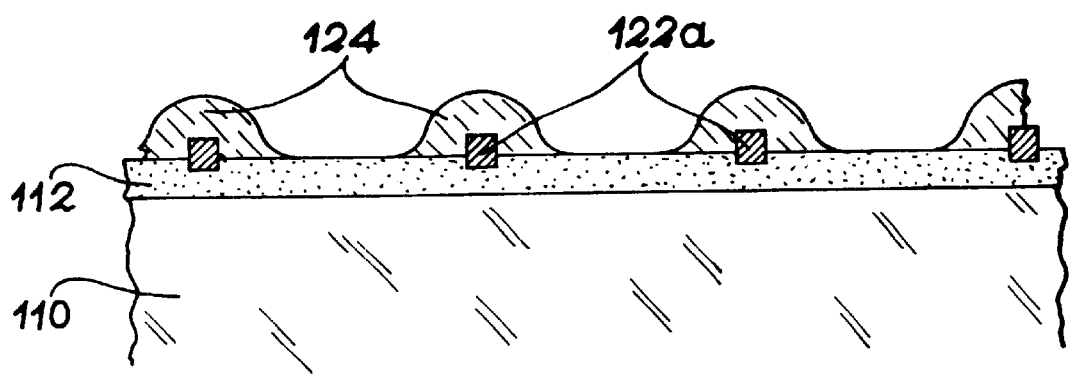
FIG. 7 is a schematic section of the support of FIG. 4, after elimination of the support structure and after the formation of semiconductor islands on the kernels.

FIGS. 5, 6 and 7 are representations of formulae of molecular structures which can also be used for this particular implementation. It is a case of organometallics derived from phthalocyanine or naphthocyanine.

In the generic formulae of these compounds, depicted in FIGS. 5, 6 and 7, R represents a functional grouping capable of initiating an interaction with the substrate such as, for example, an alkoxysilane, R' represents a hydrophilic or hydrophobic functional alkyl or aromatic organic grouping, M represents a trivalent or pentavalent metal able to form the nucleation kernel and N represents a nitrogen atom.

These molecules have a $4^{th}$ order symmetry, and are in the form of a cross where the length of the arms is determined by the size of the organic groupings which constitute them.

The distance between the metal atoms, that is to say the nucleation kernels, is determined by the length of the arms of the molecule.

Figure 8:
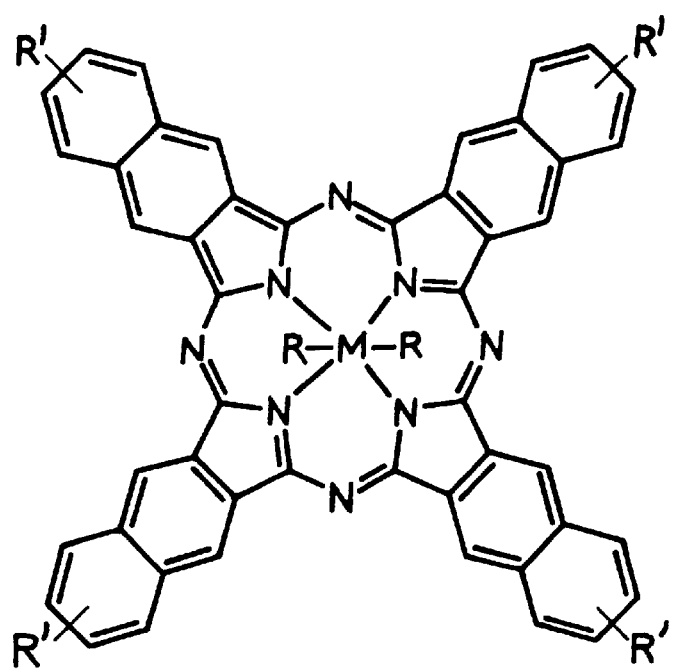

It is thus possible to obtain networks with different distances between the nucleation sites (kernels) simply by changing the organic groupings (see FIG. 8). If the molecules are functionalized so as to initiate a chemical link along their axes of symmetry and parallel to the substrate, a "square paving" can be expected from the nucleation kernels, otherwise a "hexagonal paving" can be expected.

By way of example, in order to obtain a difference between the nucleation sites of around 10 nm, a network of contiguous molecules is used whose radius is around 5 nm.

Returning to FIG. 4, it should be noted that the material of the distribution layer 116 can be formed on the surface of the silica layer 112, for example, by means of the Langmuir-Blodgett method, that is to say by a covalent grafting onto the layer of silicon of molecules having specific sites of interaction with the surface.

For forming the distribution layer according to the Langmuir-Blodgett process, the molecules have aliphatic chains on the periphery.

For forming the distribution layer according to the covalent grafting method, the molecules have specific interaction sites which can be placed, for example, either at the periphery or in an axial position.

If the molecules are functionalised so as to initiate a chemical link, for example by the formation of a carboxylic acid dimer, or ion association between a carboxylate anion and an ammonium cation along their axes of symmetry and parallel to the substrate, an improvement in the regularity of the bidimensional network results therefrom. The distances between molecules are thus fixed.

The Langmuir-Blodgett technique requires particular equipment and uses amphiphilic molecules previously organised in monolayers at an air-water interface. These organised molecules are then deposited on the substrate. The covalent grafting takes place using a solution of molecules to be deposited. The final order results from the respective locations on the molecule of the sites of interaction with the surface and sites of interaction between adjacent molecules.

When the nucleation kernels 122a of the distribution layer 116 are formed by copper or nickel atoms, there is a risk that these elements may diffuse rapidly in the insulating layer 112 when the latter is made of silica.

Thus it is possible to use an insulating layer 112 of silicon nitride or an insulating layer 112 having a sublayer of silicon nitride.

The silicon nitride then fulfils a role of diffusion barrier and makes it possible to keep the atom constituting the kernel on the surface of the insulating layer, notably during a process of depositing silicon at temperatures of above 500° C.

If necessary, in order to reduce the phenomenon of diffusion, a deposition of silicon based on disilane at low temperature (below 400° C.) can be effected.

FIG. 7 shows the formation of silicon islands 124 on the kernels 122a after elimination of the support structure 118a of the distribution layer.

Eliminating this structure can take place, as mentioned previously, by means of a heat treatment and/or by ultraviolet radiation.

The kernels, fixed to the surface of the insulating material, remain there during these treatments.

In order to prevent any parasitic nucleation between the kernels 122a, notably when the silicon deposition is effected by means of a gas based on silane (silane, disilane), hydrogen can be added to the gas during the deposition.

Thus homogeneous islands uniformly distributed on the surface of the layer of insulating material 112 are obtained.

The manufacture of a Coulomb blocking device using such a structure of semiconductor islands is supplemented by the formation of drain and source regions, and by the formation of a gate, for example. These elements are produced in accordance with techniques which are usual in the field of microelectronics.

What is claimed is:

1. A method of forming a network of islands of semiconductor material on a surface of electrically insulating material, comprising:
   a) depositing nucleation kernels on the surface of the electrically insulating material,
   b) forming islands of semiconductor material respectively on the nucleation material,
   characterized in that the deposition of the nucleation kernels is effected using at least one layer, referred to as a distribution layer, made of a material having a substantially regular molecular insulating material in order to distribute the nucleation kernels in a substantially regular fashion on the surface of the electrically insulating material, the distribution of the nucleation kernels being fixed by the molecular structure of the distribution layer.

2. A method according to claim 1, in which the distribution layer is a monomolecular layer.

3. A method according to claim 1, in which use is made of a distribution layer made of a material with a molecular structure having interstices spaced apart substantially regularly and the nucleation kernels are deposited using the distribution layer as a deposition mask for uniformly distributing the nucleation kernels, the distribution layer being eliminated after the deposition of the nucleation kernels.

4. A method according to claim 3, in which the distribution layer is made from a material chosen amongst the $4^{th}$ order symmetry molecules, of the phthalocyanine and porophyrin generic type, and in which the nucleation kernels are chosen from amongst Al, Mg, Se, Ca.

5. A method according to claim 1, in which use is made of a distribution layer made of a material having a molecular support structure and nucleation kernels distributed over the molecular support structure and in which a treatment is effected in order to separate the nucleation kernels, fixed on the surface of the insulating material, and the support structure, in order to eliminate this structure.

6. A method according to claim 5, in which the treatment for separating the nucleation kernels and the support structure includes a heat treatment and/or a treatment by ultraviolet radiation.

7. A method according to claim 5, in which the distribution layer is a layer having a structure of the porphyrin or phthalocyanine type.

8. A method according to claim 7, in which the distribution layer is a layer having a structure of the porphyrin or phthalocyanine type.

9. A method according to claim 1, in which the semiconductor material is silicon, and in which the formation of the islands includes the selective deposition of silicon on the nucleation kernels.

10. A method according to claim 9, in which the deposition of silicon is a chemical vapour deposition based on silane.

11. A method according to claim 10, in which use is made of a mixture of a gas based on silane, and hydrogen.

12. A method according to claim 1, the formation of the islands includes a heat treatment for promoting the growth of silicon on the nucleation kernels.

13. A method according to claim 1, in which the insulating material is chosen from $SiO_2$ and $Si_3N_4$.

14. A method according to claim 13, in which the insulating material is silica ($SiO_2$), in which the nucleation kernels include a metal chosen from amongst Fe, Al, Ca and Mg and in which the deposition of the nucleation kernels is accompanied by a heat treatment enabling the metal to interact with the silica.

15. A method according to claim 1, comprising, prior to step a), the preparation of the surface of insulating material by the formation of a layer of silicon oxide and/or silicon nitride on a substrate.

16. A method of manufacturing a quantal structure of the Coulomb blocking type including a network of semiconductor islands in which the network of islands is produced in accordance with claim 1.

17. A method of manufacturing a quantal structure of the Coulomb blocking type including a network of semiconductor islands in which the network of islands is produced in accordance with claim 15.

* * * * *